US011378606B2

(12) United States Patent
Santoyo-Mejia et al.

(10) Patent No.: US 11,378,606 B2
(45) Date of Patent: Jul. 5, 2022

(54) SWITCHBOARD CONTROLLER FOR MANUAL ADAPTATION OF RADIATION PATTERNS AND MEASUREMENTS OF STEERABLE PARASITIC ARRAY ANTENNA

(71) Applicant: United States of America as respresented by the Secretary of the Navy, San Diego, CA (US)

(72) Inventors: Ricardo Santoyo-Mejia, Chula Vista, CA (US); David Carlos Dawson, Lemon Grove, CA (US); Paul Michael McGinnis, San Diego, CA (US); Marcos Ontiveros, Chula Vista, CA (US)

(73) Assignee: United States of America as represented by the Secretary of the Navy, Washington, DC (US)

( * ) Notice: Subject to any disclaimer, the term of this patent is extended or adjusted under 35 U.S.C. 154(b) by 771 days.

(21) Appl. No.: 16/365,135

(22) Filed: Mar. 26, 2019

(65) Prior Publication Data
US 2020/0309836 A1  Oct. 1, 2020

(51) Int. Cl.
G01R 29/10 (2006.01)
H01Q 19/30 (2006.01)
H01H 21/22 (2006.01)
H01Q 1/48 (2006.01)

(52) U.S. Cl.
CPC ............. G01R 29/10 (2013.01); H01H 21/22 (2013.01); H01Q 1/48 (2013.01); H01Q 19/30 (2013.01)

(58) Field of Classification Search
CPC ................ H01H 21/22; G01R 29/0871; G01R 29/0878; G01R 29/10; G01R 29/105; H01Q 3/446
See application file for complete search history.

(56) References Cited

U.S. PATENT DOCUMENTS

| 5,767,807 A | * | 6/1998 | Pritchett | ................. | H01Q 3/24 343/834 |
| 2011/0249831 A1 | * | 10/2011 | Bellamy | .............. | H04B 7/0874 381/94.1 |

* cited by examiner

Primary Examiner — Dameon E Levi
Assistant Examiner — Leah Rosenberg
(74) Attorney, Agent, or Firm — Naval Information Warfare Center Pacific; Kyle Eppele; J. Eric Anderson

(57) ABSTRACT

A switchboard controller for a parasitic antenna array. The switchboard controller has an internal bias tee mounted within an RF-shielded enclosure. The internal bias tee has an RF port, a DC port, and an RF & DC port. The RF port is configured to be connected to a driven element of the parasitic array antenna, and the RF & DC port is configured to be connected to an RF and DC source. The switchboard controller also has a voltage regulator mounted within the enclosure and is electrically connected to the DC port. The switchboard controller also has a plurality of manual switches electrically connected to the voltage regulator, each switch operatively connected to a separate parasitic element of the parasitic array antenna. The switches are mounted on the back side of a frame in a 2-dimensional pattern that is similar to the physical layout of the parasitic elements.

14 Claims, 4 Drawing Sheets

SWITCHBOARD CONTROLLER FOR MANUAL ADAPTATION OF RADIATION PATTERNS AND MEASUREMENTS OF STEERABLE PARASITIC ARRAY ANTENNA

FEDERALLY-SPONSORED RESEARCH AND DEVELOPMENT

The United States Government has ownership rights in this invention. Licensing and technical inquiries may be directed to the Office of Research and Technical Applications, Naval Information Warfare Center Pacific, Code 72120, San Diego, Calif., 92152; voice (619) 553-5118; ssc_pac_t2@navy.mil. Reference Navy Case No. 103661.

BACKGROUND OF THE INVENTION

Parasitic array antennas such as those used for Aerial Beamforming (ABF) require the proper activation of their parasitic elements to achieve the desired impedance loading that modifies the radiation pattern of the antenna. This activation of parasitic elements takes place in specific configurations, some of them will be activated some of them will not, depending on the desired end effect. Activation of these parasitic elements is typically accomplished through radio frequency (RF) switches that require a steady bias voltage. The specific configurations are known beforehand and are usually facilitated by software, i.e. a logic string sent from a central processing unit (CPU). A particular problem with this type of antennas is that the actual logic string sent cannot be verified during the measurement and testing of the antenna. It is extremely important to know that the string command is correct and that the proper parasitic elements have been activated to trust the measurement results. There is a need for an improved device for accurately testing and measuring parasitic array antennas.

SUMMARY

Disclosed herein is a switchboard controller comprising: a frame, an enclosure, an internal bias tee, a voltage regulator, and a plurality of manual switches. The frame has front and back sides and the enclosure is mounted to the front side. The interior of the enclosure is shielded from RF interference. The exterior surface of the enclosure is configured such that a parasitic array antenna may be mounted thereto. The internal bias tee is mounted within the enclosure and has an RF port, a direct current (DC) port, and an RF & DC port. The RF port is configured to be connected to a driven element of the parasitic array antenna, and the RF & DC port is configured to be connected to an RF and DC source. The voltage regulator is mounted within the enclosure and electrically connected to the DC port. The manual switches are electrically connected to the voltage regulator, each switch operatively connected to a separate parasitic element of the parasitic array antenna. The switches are mounted on the back side in a 2-dimensional pattern that is similar to the physical layout of the parasitic elements.

BRIEF DESCRIPTION OF THE DRAWINGS

Throughout the several views, like elements are referenced using like references. The elements in the figures are not drawn to scale and some dimensions are exaggerated for clarity.

DETAILED DESCRIPTION OF EMBODIMENTS

The disclosed switchboard controller below may be described generally, as well as in terms of specific examples and/or specific embodiments. For instances where references are made to detailed examples and/or embodiments, it should be appreciated that any of the underlying principles described are not to be limited to a single embodiment, but may be expanded for use with any of the other methods and systems described herein as will be understood by one of ordinary skill in the art unless otherwise stated specifically.

Figure 1A:
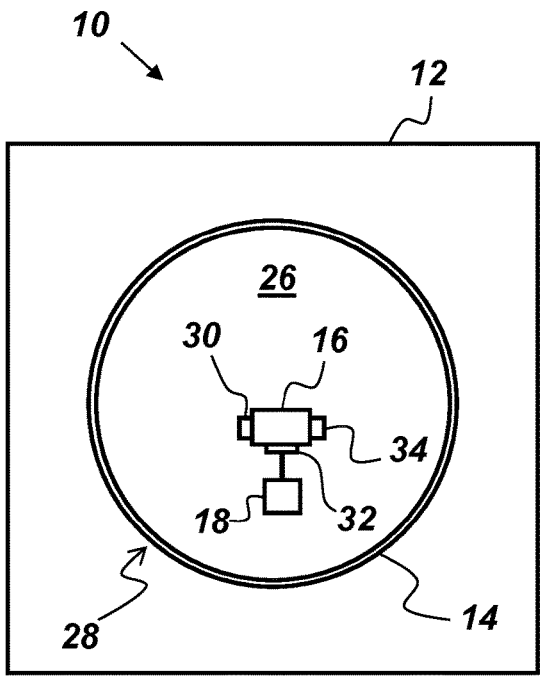
FIG. 1A is a front-view illustration of an embodiment of a switchboard controller.
Figure 1B:
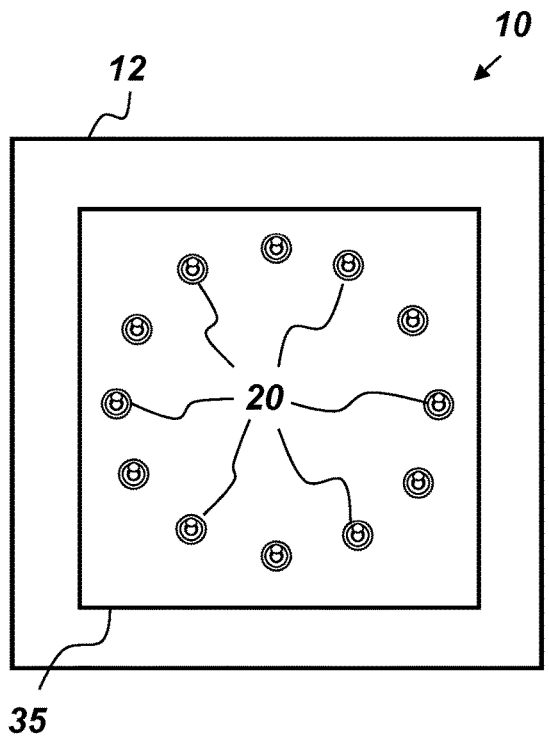
FIG. 1B is a back-view illustration of an embodiment of a switchboard controller.
Figure 1C:
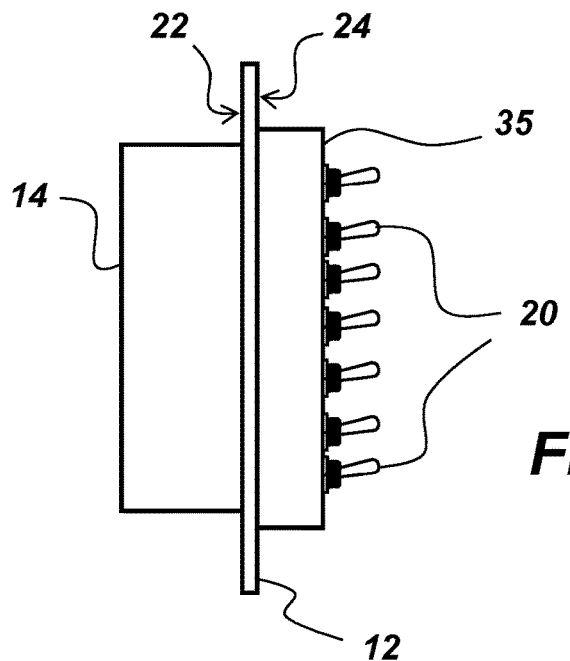
FIG. 1C is a side-view illustration of an embodiment of a switchboard controller.
Figure 2:
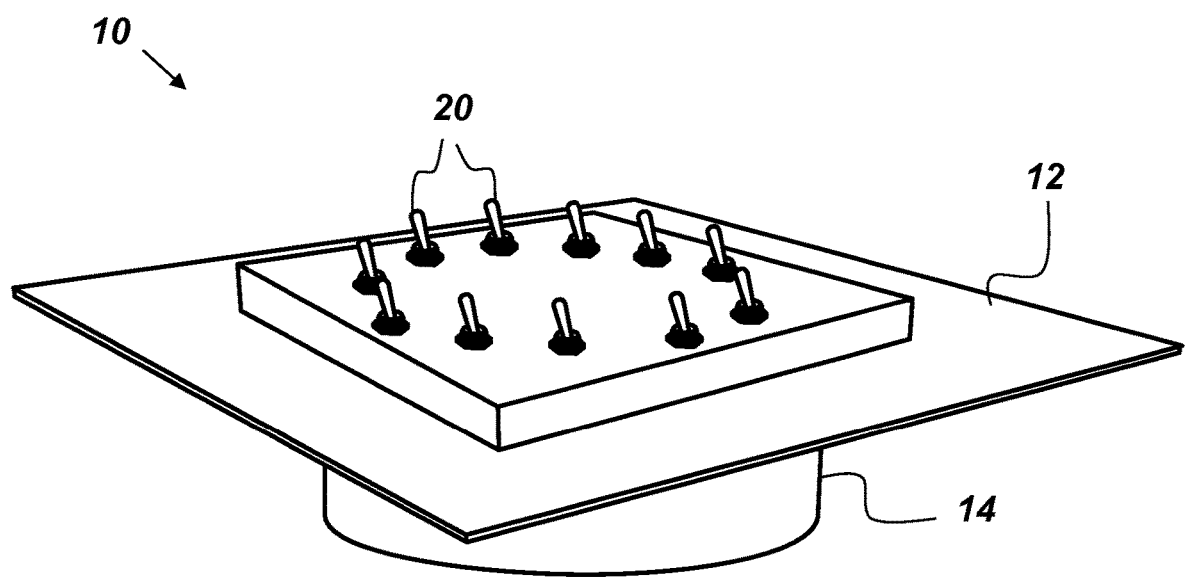
FIG. 2 is a perspective-view illustration of an embodiment of a switchboard controller.

FIGS. 1A-1C and FIG. 2 are illustrations of an embodiment of a switchboard controller 10 that comprises, consists of, or consists essentially of a frame 12, an enclosure 14, an internal bias tee 16, a voltage regulator 18, and a plurality of manual switches 20. FIG. 1A is a front view of the switchboard controller 10. FIG. 1B is a back view of the switchboard controller 10. FIG. 1C is a side view of the switchboard controller 10. FIG. 2 is a perspective-view illustration of the embodiment of the switchboard controller 10 depicted in FIGS. 1A-1C. The frame 12 has a front side 22 and a back side 24. The enclosure 14 is mounted to the front side 22. The interior 26 of the enclosure 14 is shielded from radio frequency (RF) interference. The exterior surface 28 of the enclosure 14 is configured such that a parasitic array antenna (such as the parasitic array antenna 36 shown in FIG. 3B) may be mounted thereto. The internal bias tee 16 is mounted within the enclosure 14 and has an RF port 30, a direct current (DC) port 32, and an RF & DC port 34. The RF port 30 is configured to be connected to a driven element of the parasitic array antenna (such as the driven element 38 shown in FIG. 3B). The RF & DC port 34 is configured to be connected to an RF and DC source (such as the antenna positioner 44 shown in FIG. 3B). The voltage regulator 18 is mounted within the enclosure 14 and electrically connected to the DC port 32. The manual switches 20 are electrically connected to the voltage regulator 18. Each manual switch 20 is operatively connected to a separate parasitic element of the parasitic array antenna (such as the parasitic elements 40 shown in FIG. 3B). The switches 20 may be mounted on a box 35 of any desired size and shape mounted to the back side 24 of the frame 12. The manual switches 20 are arranged in a 2-dimensional pattern that is similar to the physical layout of the parasitic elements of the parasitic array antenna that is under test. (See FIGS. 3A and 3B)

Figure 3A:
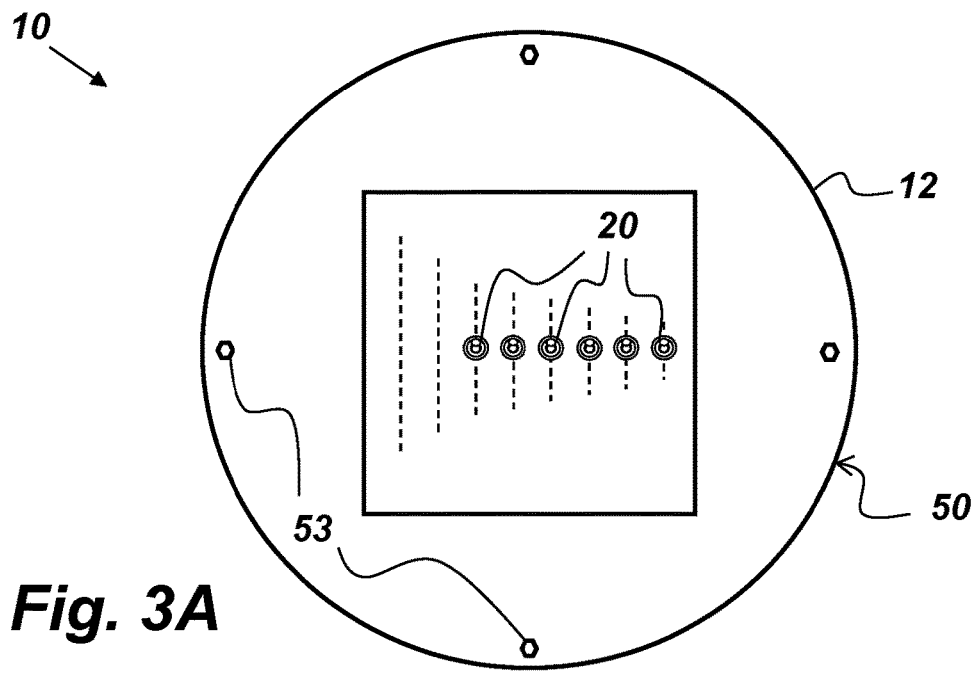
FIG. 3A is a back-view illustration of an embodiment of a switchboard controller.
Figure 3B:
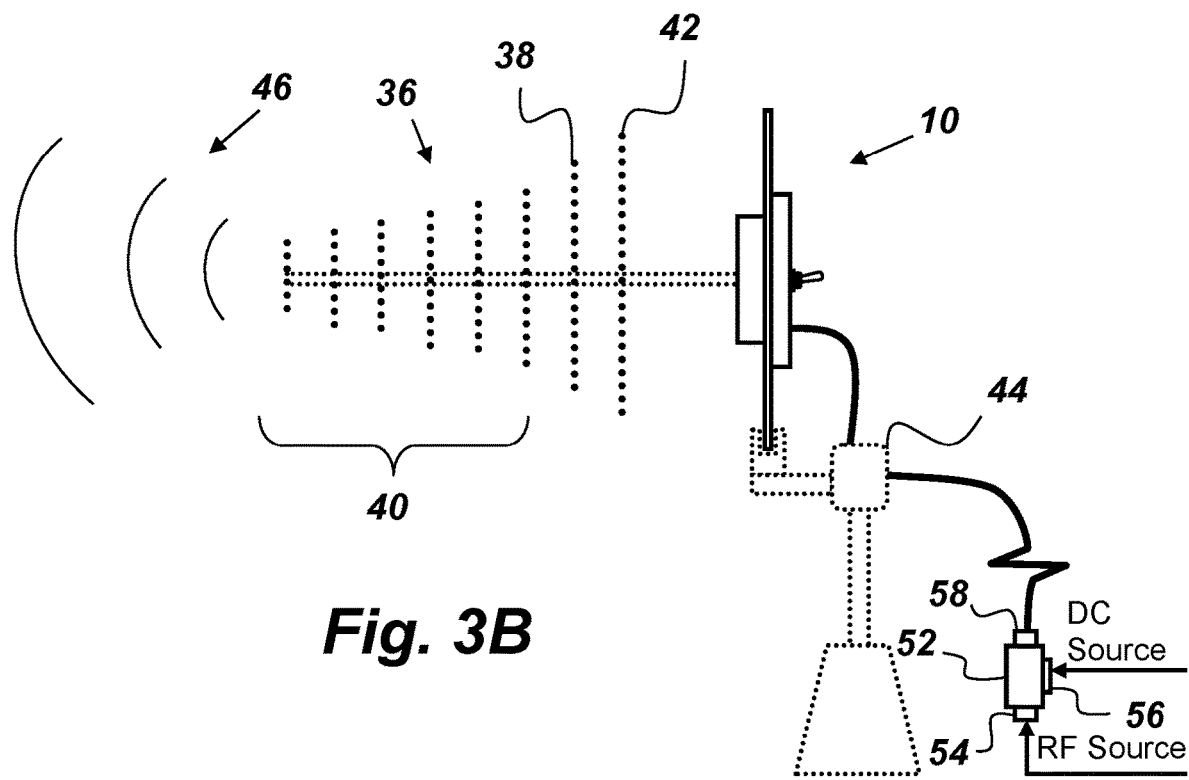
FIG. 3B is a side-view illustration of an embodiment of a switchboard controller.

FIG. 3A is a back-view illustration of an embodiment of the switchboard controller 10 configured for testing a yagi-uda-type parasitic array antenna. FIG. 3B shows a side-view illustration of the embodiment of the switchboard controller 10 configured for testing a parasitic array antenna 36, which in this case is a yagi-uda antenna array. It is to be understood that the parasitic array antenna 36 is not limited to yagi-uda antenna arrays, but may be any antenna array having parasitic elements. The parasitic array antenna 36 comprises a driven element 38, parasitic elements 40, and a reflector 42. In FIG. 3B, the switchboard controller 10 is mounted on an antenna positioner 44. As can be seen in FIG. 3A, the manual switches 20 are arranged on the back side 24 of the switchboard controller 10 in a 2-dimensional pattern that is similar to the physical layout of the parasitic elements 40 of the parasitic array antenna 36 mounted to the switchboard controller 10. The switchboard controller 10 provides for visual verification of which parasitic elements are functioning by looking to see which switches are thrown and which are not. The manual switches 20 are mounted on the back side 24 of the frame 12 in such a way as to face away from the antenna-under-test (AUT) main beam 46. This minimizes RF interference, distortion of the radiation pattern and facilitates access of a user to manually switch the parasitic configuration.

The switchboard controller 10 enables the manual activation of parasitic elements 40 in a parasitic array antenna 36 so that the antenna's radiation pattern may be adapted for testing and measurement purposes. The switchboard controller 10 allows this radiation pattern adaptation without the use of the standard logic circuitry that it would normally require in automated form. The switchboard controller 10 enables verification that an AUT is functioning correctly by manually applying the proper power to each manual switch 20, which in turn may apply the correct bias to individual RF switches 47 corresponding to individual parasitic elements 40. Furthermore, the switchboard controller 10 allows for the antenna itself and the adaptability of its radiation patterns to be tested and measured independently of any other hardware or software. The switchboard controller 10 may be used to test an electronically-steerable, parasitic-array, radiator antenna, which uses linearly polarized monopoles to azimuthally modify the radiation pattern of an, otherwise circularly polarized, antenna. Such an antenna requires specific mounts to accurately measure for radiation pattern not only broadside, but also in the periphery of the main beam, where deep nulls are expected to appear after adaptation. The switchboard controller 10 is the only device known to be in existence that can accomplish the specific requirements for testing and measuring the radiation patterns of a parasitic array antenna that uses linearly polarized monopoles to azimuthally modify the radiation pattern of an, otherwise circularly polarized, antenna.

Figure 4:
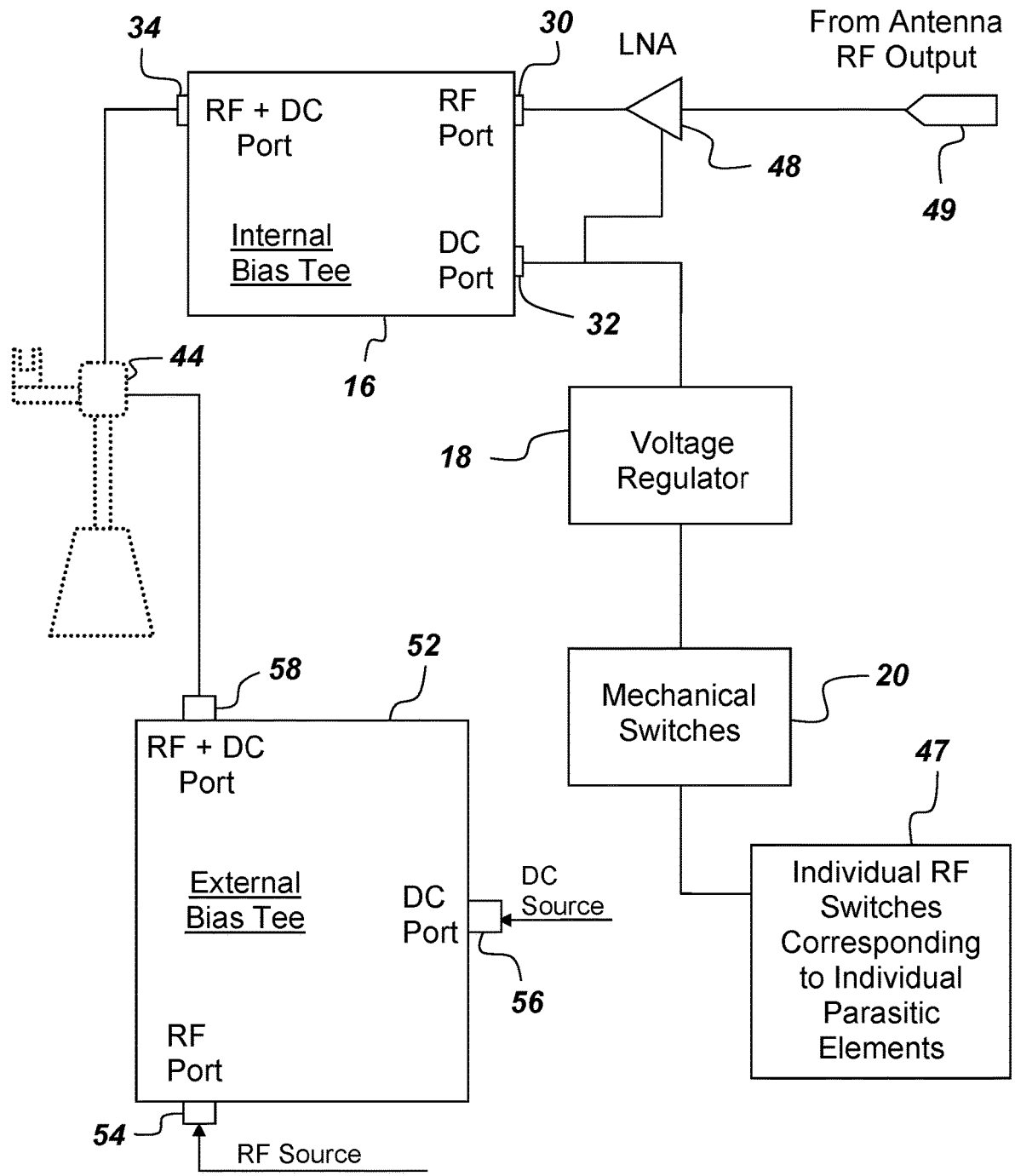
FIG. 4 is a block diagram of an embodiment of a switchboard controller.

FIG. 4 is a functional block diagram of an embodiment of the switchboard controller 10. The switchboard controller 10 provides bias voltage, through the internal decoupling bias-tee 16, for the plurality of manual switches 20, which in one embodiment may be single-pole-double-throw (SPDT) switches. The internal bias tee 16 may also be configured to feed the proper voltage to a low noise amplifier (LNA) 48. The LNA 48 is meant to amplify low power signals and to set the noise figure of the switchboard controller 10. It is desirable for the LNA 48 to be mounted as close as reasonably possible to an antenna RF output 49. A ribbon cable in the enclosure 14 may be used to connect the manual switches 20 to the RF switches 47 of the AUT that is mounted to the enclosure 14. The voltage regulator 18 ensures the proper stability needed for sensitive RF switches 47. In one embodiment, the enclosure 14 may be a sheet metal box, properly sealed, that provides protection from physical damage and RF interference. This switchboard controller 10 is also designed to be mounted on standard three-axis positioners (such as the antenna positioner 44 shown in FIG. 3B) for radiation pattern measurements. The frame 12 of the switchboard controller 10 may be made of any desired conductive material and may have any desired size and shape. The frame 12 serves as a ground plane. The enclosure 14 may be any desired size and shape that can contain the internal bias tee 16 and the voltage regulator 18 and to which the parasitic antenna array 36 may be mounted. In one suitable embodiment, the enclosure 14 is a cylindrical aperture similar to the base of a magnetic mount parasitic array antenna. The enclosure 14 is designed to physically protect internal components and to prevent RF interference.

The following is a description of how an embodiment of the switchboard controller 10 may be used in operation. First, a specific steerable array antenna to be tested/measured (AUT) is mounted on the front side 22 of the switchboard controller 10. The switchboard controller 10 is next mounted on a three-axis positioner for measurement(s) and a desired set of manual switches 20 is turned on/off according to the desired configuration. The switchboard controller 10 can be mounted on the three-axis positioner (such as the antenna positioner 44 depicted in FIG. 3B) using standard mounting brackets, or standoff bolts, which can be made of metal or non-metal material.

These brackets or standoffs may be attached to the frame 12 near an edge of the frame 12. For example, in reference to FIG. 3A, in one embodiment, four standoff bolts 53 are positioned 3.175 centimeters (1.25 inches) from an edge 50 of the frame 12. In this embodiment, the standoff bolts 53 are positioned 90 degrees away from each other. External power to the switchboard controller 10 may be provided through an external bias tee 52. The external bias tee 52 has an RF port 54, a DC port 56, and an RF & DC port 58. The external bias tee's RF port 54 is connected to an RF source, the external bias tee's DC port 56 is connected to a DC source, and the external bias tee's RF & DC port 58 is connected to the RF & DC port 34 of the internal bias tee 16 through the antenna positioner 44's RF connector. For example, a 15-volt DC signal may be coupled with an RF signal through the external bias tee 52. The DC signal and the RF signal may be from a receiver for example. This DC voltage is decoupled again at the internal bias tee 16, and split in two ways: one directly feeding the LNA 48 and the other one going through the voltage regulator 18, a suitable example of which is a low drop out (LDO) voltage regulator, to provide the regulated 3.3-volt DC bias needed to power the RF switches 47 of the AUT in this embodiment. This allows the AUT to be biased through the same RF cable of the three axis positioner 44.

From the above description of the switchboard controller 10, it is manifest that various techniques may be used for implementing the concepts of switchboard controller 10 without departing from the scope of the claims. The described embodiments are to be considered in all respects as illustrative and not restrictive. The method/apparatus disclosed herein may be practiced in the absence of any element that is not specifically claimed and/or disclosed herein. It should also be understood that switchboard controller 10 is not limited to the particular embodiments described herein, but is capable of many embodiments without departing from the scope of the claims.

We claim:

1. A switchboard controller comprising:
a frame having front and back sides;
an enclosure mounted to the front side, wherein an interior of the enclosure is shielded from radio frequency (RF) interference, and wherein an exterior surface of the enclosure is configured such that a parasitic array antenna may be mounted thereto;

an internal bias tee mounted within the enclosure, the internal bias tee having an RF port, a direct current (DC) port, and an RF & DC port, wherein the DC port is configured to be connected to a driven element of the parasitic array antenna, and the RF & DC port is configured to be connected to an RF and DC source;

a voltage regulator mounted within the enclosure and electrically connected to the DC port; and a plurality of manual switches electrically connected to the voltage regulator, wherein each switch of the plurality of manual switches is operatively connected to a separate parasitic element of the parasitic array antenna, wherein the plurality of manual switches are mounted on the back side in a 2-dimensional pattern that is similar to the physical layout of the parasitic elements.

2. The switchboard controller of claim 1, wherein each of the plurality of manual switches is a single-pole-double throw (SPDT) toggle switch.

3. The switchboard controller of claim 1, wherein the exterior surface of the enclosure is configured to hold a Yagi-Uda parasitic array antenna.

4. The switchboard controller of claim 1, wherein the manual switches are arranged in a circular pattern on the back side.

5. The switchboard controller of claim 2, wherein each switch of the plurality of manual switches is configured to provide proper voltage levels from the voltage regulator to an RF switch associated with a corresponding parasitic element.

6. The switchboard controller of claim 2, wherein the frame is conductive and acts as ground plane separating the front and back sides.

7. The switchboard controller of claim 1, wherein the enclosure is cylindrical.

8. The switchboard controller of claim 6, wherein the frame is configured to be mounted to a test-stand via stand-off bolts positioned approximately 3-4 centimeters from an edge of the ground plane 90 degrees away from each other.

9. The switchboard controller of claim 1, further comprising an external bias tee having an RF port, a DC port, and an RF & DC port, wherein the external bias tee's RF port is connected to an RF source, the external bias tee's DC port is connected to a DC source, and the external bias tee's RF & DC port is connected to the RF & DC port of the internal bias tee.

10. The switchboard controller of claim 9, wherein the DC source is configured to provide a 15-volt DC signal.

11. The switchboard controller of claim 1, wherein the RF and DC source is a receiver.

12. The switchboard controller of claim 10, wherein the voltage regulator is a low-drop-out (LDO) voltage regulator.

13. The switchboard controller of claim 12, wherein the voltage regulator is configured to provide 3.3 volts of DC bias voltage to power RF switches associated with the parasitic elements.

14. The switchboard controller of claim 1, wherein the RF port and the DC port are configured to be connected to a low-noise amplifier (LNA) that is connected to a driven element of the parasitic array antenna.

* * * * *